(12) United States Patent
Masson et al.

(10) Patent No.: US 10,024,886 B2
(45) Date of Patent: Jul. 17, 2018

(54) DEVICE FOR CORRECTING THE VOLTAGE OFFSET OF A WHEATSTONE BRIDGE

(71) Applicant: STMicroelectronics (Grenoble 2) SAS, Grenoble (FR)

(72) Inventors: Thierry Masson, Varces (FR); Serge Pontarollo, Saint-Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 162 days.

(21) Appl. No.: 14/837,556

(22) Filed: Aug. 27, 2015

(65) Prior Publication Data
US 2016/0154031 A1    Jun. 2, 2016

(30) Foreign Application Priority Data
Dec. 2, 2014 (FR) ...................... 14 61773

(51) Int. Cl.
*G01R 17/06* (2006.01)
*G01D 3/036* (2006.01)
*G01R 17/10* (2006.01)

(52) U.S. Cl.
CPC ............ *G01R 17/06* (2013.01); *G01D 3/036* (2013.01); *G01R 17/10* (2013.01)

(58) Field of Classification Search
USPC ......... 324/98, 162, 207.12, 750.01; 341/144, 341/120, 135; 327/132, 53; 330/252; 363/17
See application file for complete search history.

(56) References Cited

U.S. PATENT DOCUMENTS

| 4,063,447 | A | * | 12/1977 | Mathison | ............... | G01N 27/16 324/130 |
| 5,024,101 | A | | 6/1991 | Tanaka et al. | | |
| 5,764,067 | A | * | 6/1998 | Rastegar | ............... | G01D 3/028 324/706 |
| 6,198,296 | B1 | * | 3/2001 | Ivanov | ................... | G01D 3/021 307/131 |
| 2001/0010467 | A1 | | 8/2001 | Oguma et al. | | |

(Continued)

FOREIGN PATENT DOCUMENTS

| CN | 1871790 A | 11/2006 |
| DE | 19653592 A1 | 6/1997 |
| DE | 60109660 T2 | 3/2006 |

OTHER PUBLICATIONS

First Office Action and Search Report from co-pending CN Appl. No. 201510604167.3 dated Nov. 10, 2016 (6 pages).

(Continued)

*Primary Examiner* — Daniel Miller
*Assistant Examiner* — Nasima Monsur
(74) *Attorney, Agent, or Firm* — Crowe & Dunlevy

(57) ABSTRACT

A circuit includes a Wheatstone bridge and a correction circuit operable to correct an output voltage offset of the Wheatstone bridge. The correction circuit includes a supply module configured to supply the Wheatstone bridge with a voltage and output a first current applied to the Wheatstone bridge and output a second current proportional to the first current. A digital/analog current converter outputs a correction current to the outputs of the Wheatstone bridge circuit in response to a digital correction signal and the second current.

20 Claims, 2 Drawing Sheets

(56) References Cited

U.S. PATENT DOCUMENTS

| | | | |
|---|---|---|---|
| 2002/0067255 A1* | 6/2002 | Tanizawa | G01L 9/045 340/514 |
| 2008/0028848 A1* | 2/2008 | Christensen | A61B 5/0878 73/195 |
| 2013/0239695 A1* | 9/2013 | Tai | G05F 3/30 73/766 |
| 2013/0319136 A1 | 12/2013 | Chau et al. | |
| 2013/0342273 A1* | 12/2013 | Petrie | H03F 3/45623 330/253 |

OTHER PUBLICATIONS

Search Report and Written Opinion for co-pending DE Application No. 102015115230.4 dated Jun. 8, 2016 (10 pages).
INPI Search Report and Written Opinion for FR 1461773 dated Jul. 20, 2015 (8 pages).
Second Office Action and Search Report from co-pending CN Appl. No. 201510604167.3 dated Jul. 31, 2017 (7 pages).

\* cited by examiner

DEVICE FOR CORRECTING THE VOLTAGE OFFSET OF A WHEATSTONE BRIDGE

PRIORITY CLAIM

This application claims priority from French Application for Patent No. 1461773 filed Dec. 2, 2014, the disclosure of which is incorporated by reference.

TECHNICAL FIELD

Embodiments relate to Wheatstone bridge circuits, and more precisely to the correction of their voltage offset. The embodiments applys in particular to Wheatstone bridge sensors intended to measure, for example, physical phenomena at low speed, such as: pressure, temperature, gas detection, etc.

BACKGROUND

Wheatstone bridge sensors generally comprise a Wheatstone bridge circuit and a high-impedance preamplifier intended to amplify the output voltage of the Wheatstone bridge, which is proportional to the supply voltage of the Wheatstone bridge.

However, the full-scale output voltage of this type of Wheatstone bridge sensor is often very low, for example from 10 to 50 mV/V. It then requires high-precision preamplification before optional digital conversions and an offset correction of the input signals of the preamplifier, that is to say the output signals of the Wheatstone bridge.

This offset may be due to mismatching of the resistors of the Wheatstone bridge or the temperature variation, and may be of the same order of magnitude, for example from 10 to 30 mV/V, as the full-scale output voltage. It is consequently necessary as far as possible to avoid amplifying this offset of output signals of the Wheatstone bridge.

Furthermore, since the typical passband of the low-speed physical values is generally from 0.1 to 100 Hz, it is desirable to have a noise level which is as low as possible.

SUMMARY

One embodiment provides a device for correcting the voltage offset of a Wheatstone bridge, which is independent of the gain of the amplifier chain while ensuring that the offset correction follows the possible variations of the supply voltage of the Wheatstone bridge as well as the possible variations of the values of the resistors of the Wheatstone bridge as a function of temperature.

Another embodiment provides an offset correction which is insensitive to the 1/f noise of the amplifier chain.

One possible solution provides:
driving of the Wheatstone bridge with a current source and a follower amplifier so as to replicate the supply voltage or a voltage derived from this supply voltage on the Wheatstone bridge itself,
generating a second current proportional to that delivered by the current source and using this second current as a reference current of a digital/analog current converter, and
adjusting, for example during a calibration phase, the output current of the converter on the basis of a digital correction signal so as to cancel out the voltage offset as far as possible.

Thus, one aspect provides an electronic device comprising a Wheatstone bridge circuit and a correction circuit coupled to the Wheatstone bridge circuit and configured in order to correct an offset of the output voltage of the Wheatstone bridge.

According to one general characteristic of this aspect, the correction circuit comprises an input interface for receiving a first voltage, a supply module configured in order to supply the Wheatstone bridge circuit with a second voltage drawn from the first voltage and with a first current slaved to the present value of the resistors of the Wheatstone bridge circuit and in order to form a second current proportional to the first current, and a digital/analog converter configured in order to deliver a correction current to the outputs of the Wheatstone bridge circuit on the basis of a digital correction signal and the second current.

The second voltage may be substantially equal or substantially proportional to the first voltage.

The first current is typically inversely proportional to the present value of the resistors of the Wheatstone bridge circuit. For this reason, this first current slaved in this way can follow the possible variation of the resistors of the Wheatstone bridge circuit as a function of temperature.

Furthermore, the digital/analog converter for example comprises a first converter input intended to receive the second current, a second converter input intended to receive the digital correction signal and a differential current output coupled to the two outputs of the Wheatstone bridge circuit in order to deliver the correction current.

Since the second current is proportional (the coefficient of proportionality may be equal to 1 or different to 1) to the first current, it is then also capable of following the possible variation of the resistors of the Wheatstone bridge circuit, and this second current is used as a reference current in the digital/analog converter.

Thus, for a given Wheatstone bridge circuit and temperature, it is possible to adjust the value of the digital correction signal during a calibration phase in order to deliver a differential current signal which can cancel out the voltage offset at the output of the Wheatstone bridge circuit. This output current is by its nature related directly to the second current, and therefore indirectly to the first current, to the first voltage and to the second voltage. The offset correction consequently follows in particular the possible variation of the supply voltage of the Wheatstone bridge and of the resistors of the Wheatstone bridge as a function of temperature. The technological imperfections may therefore be corrected automatically and simply, without using a high-level sensor with high cost.

Furthermore, such an electronic device can cancel out the offset of the output signals of the Wheatstone bridge before the preamplification stage, while being insensitive to the gain and to the 1/f noise of the preamplifier.

According to one embodiment, the supply module comprises:
a first current source intended to deliver the first current and driven by a follower amplifier, one input of which is coupled to the input interface, the output of the first current source being coupled to a supply terminal of the Wheatstone bridge circuit, which terminal is coupled to the other input of the follower amplifier, and
a second current source intended to deliver the second current and driven by the follower amplifier, the output of the second current source being coupled to the first converter input.

The follower amplifier makes it possible to provide a replica of the first voltage at the supply terminal of the Wheatstone bridge circuit.

The first current source may comprise at least one first bipolar transistor, of which the base is coupled to the output of the follower amplifier and the collector is coupled to the supply terminal of the Wheatstone bridge circuit, and the second current source may comprise at least one second bipolar transistor, of which the base is coupled to the output of the follower amplifier and the collector is coupled to the first converter input.

Specifically, the use of bipolar transistors, for example of the PNP type, for the current sources makes it possible to intrinsically limit the 1/f noise of these current sources and to further improve the performance of the Wheatstone bridge.

As a variant, the supply module may comprise:
- at least one first PMOS transistor, of which the gate is coupled to the output of the follower amplifier and the drain is coupled to the supply terminal of the Wheatstone bridge circuit through a first chopper circuit and to the first converter input through a second chopper circuit,
- at least one second PMOS transistor, of which the gate is coupled to the output of the follower amplifier and the drain is coupled to the supply terminal of the Wheatstone bridge circuit through a third chopper circuit and to the first converter input through a fourth chopper circuit, and
- control means configured in order to control the chopper circuits so that the first current source alternatively comprises the at least one first PMOS transistor or the at least one second PMOS transistor, and the second current source alternatively comprises the at least one second PMOS transistor or the at least one first PMOS transistor.

The 1/f noise of the MOS transistor or transistors of the first current source fed back onto the follower amplifier is attenuated by the presence of the loop. This is not the case for the MOS transistor or transistors which are not in the loop.

The presence of the chopper circuits acting as a network of switches makes it possible to distribute over time that or those of the first and second transistors which will be fed back onto the follower amplifier or connected to the first input of the converter, and therefore to reduce the 1/f noise generated by the current sources.

BRIEF DESCRIPTION OF THE DRAWINGS

Other advantages and characteristics of the invention will become apparent on studying the detailed description of embodiments, which are taken by way of non-limiting examples and are illustrated by the appended drawings, in which.

DETAILED DESCRIPTION

Figure 1:
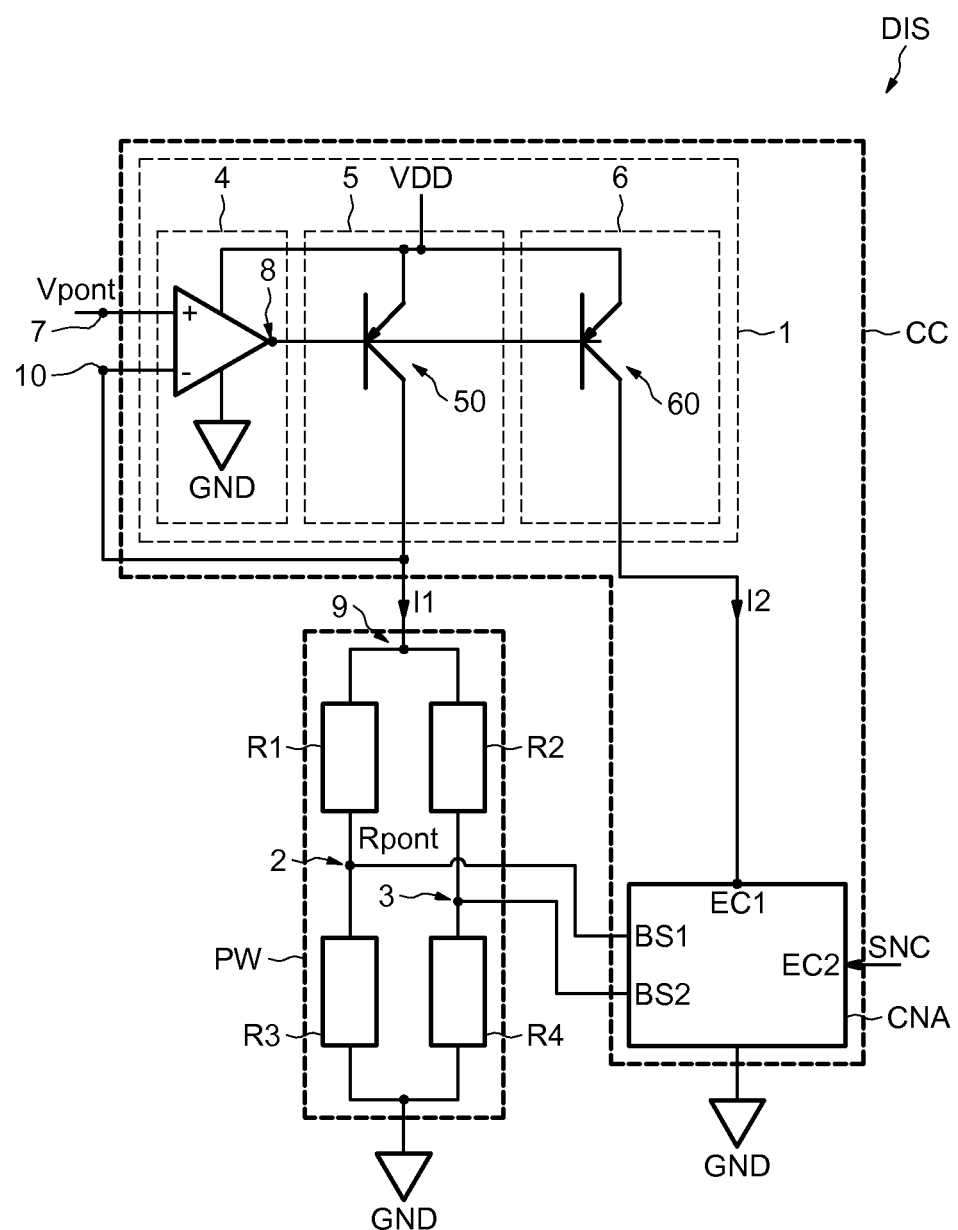
FIGS. 1 and 2 relate to different embodiments of an electronic device.

Reference is now made to FIG. 1 in order to illustrate an embodiment of an electronic device DIS, incorporated for example within a Wheatstone bridge sensor.

The electronic device DIS comprises a correction circuit CC and a Wheatstone bridge circuit PW.

The correction circuit CC comprises a supply module 1 and a digital/analog current converter CNA having a differential current output BS1 and BS2 coupled with the outputs 2 and 3 of the Wheatstone bridge circuit PW.

The supply module 1 comprises a follower amplifier 4, a first current source 5 having a first PNP bipolar transistor 50 and a second current source 6 having a second PNP bipolar transistor 60.

An input interface 7 is coupled to the noninverting input of the follower amplifier 4.

The bases of the two bipolar transistors 50 and 60 of the two current sources 5 and 6 are coupled jointly to the output 8 of the follower amplifier 4.

The collector of the first bipolar transistor 50 is coupled to a supply terminal 9 of the circuit of the Wheatstone bridge PW, which terminal is coupled to the inverting input 10 of the follower amplifier 4.

The first converter input EC1 is coupled to the collector of the second bipolar transistor 60 of the second current source 6. The converter CNA receives a digital correction signal SNC via the second converter input EC2.

The emitters of the transistors 50 and 60 are connected to a supply voltage VDD.

In this example, the circuit of the Wheatstone bridge has four theoretically identical resistors R1-R4 having a resistance value equal to Rpont, which are connected between the supply terminal 9 and the ground GND.

When a Wheatstone bridge circuit PW is balanced, there is a zero voltage at the outputs 2 and 3 of the circuit of the Wheatstone bridge.

Because of technological imperfections, for example mismatching of the resistors of the Wheatstone bridge PW, there may be a possible variation of the value of the resistors of the Wheatstone bridge PW. Consequently, the Wheatstone bridge PW becomes unbalanced and there is a voltage offset at the output of the Wheatstone bridge PW.

In a calibration phase, carried out for example in the factory after fabrication of the integrated circuit, there is an offset correction for rebalancing the circuit of the Wheatstone bridge PW.

The supply voltage Vpont of the Wheatstone bridge PW, present at the input interface 7, is replicated at the supply terminal 9 of the circuit of the Wheatstone bridge PW by the follower amplifier 4. The overall resistance of the Wheatstone bridge is approximately equal to Rpont, taking into account technological imperfections, and the first current I1 provided by the first current source 5 in order to supply the Wheatstone bridge circuit PW is approximately equal to Vpont/Rpont.

The second current source 6 delivers a second current I2, which is proportional to the first current I1 due to the current mirroring configuration of sources 5 and 6, to the first converter input EC1 as a reference current. The coefficient of proportionality for the current mirroring depends on the dimensional ratio between the transistors 50 and 60.

During the calibration phase, the differential current output BS1 and BS2 of the digital/analog converter CNA is adjusted until the voltage offset at the output of the Wheatstone bridge is cancelled out, by adjusting the value of the digital correction signal SNC received at the second converter input EC2.

Once the Wheatstone bridge is balanced again (zero voltage at the outputs 2 and 3 of the circuit of the Wheatstone bridge), the value of the digital correction signal SNC is fixed and stored for the converter CNA and will be used during subsequent operation of the converter CNA.

Since the reference current of the digital/analog converter CNA is proportional to the first current I1, which is itself related to the supply voltage of the circuit of the Wheatstone bridge PW and to the present value of the resistors R1-R4 of the Wheatstone bridge PW, the differential current output of the converter CNA, which differential output is configured in order to cancel out the voltage offset at the output of the Wheatstone bridge PW, follows the possible variation of the supply voltage Vpont and of the resistances Rpont of the Wheatstone bridge PW as a function of temperature.

The use of bipolar transistors in the supply module 1 and optionally in the digital/analog converter CNA makes it possible to intrinsically limit the 1/f noise of the current sources and optionally of the digital/analog current converter CNA.

Figure 2:
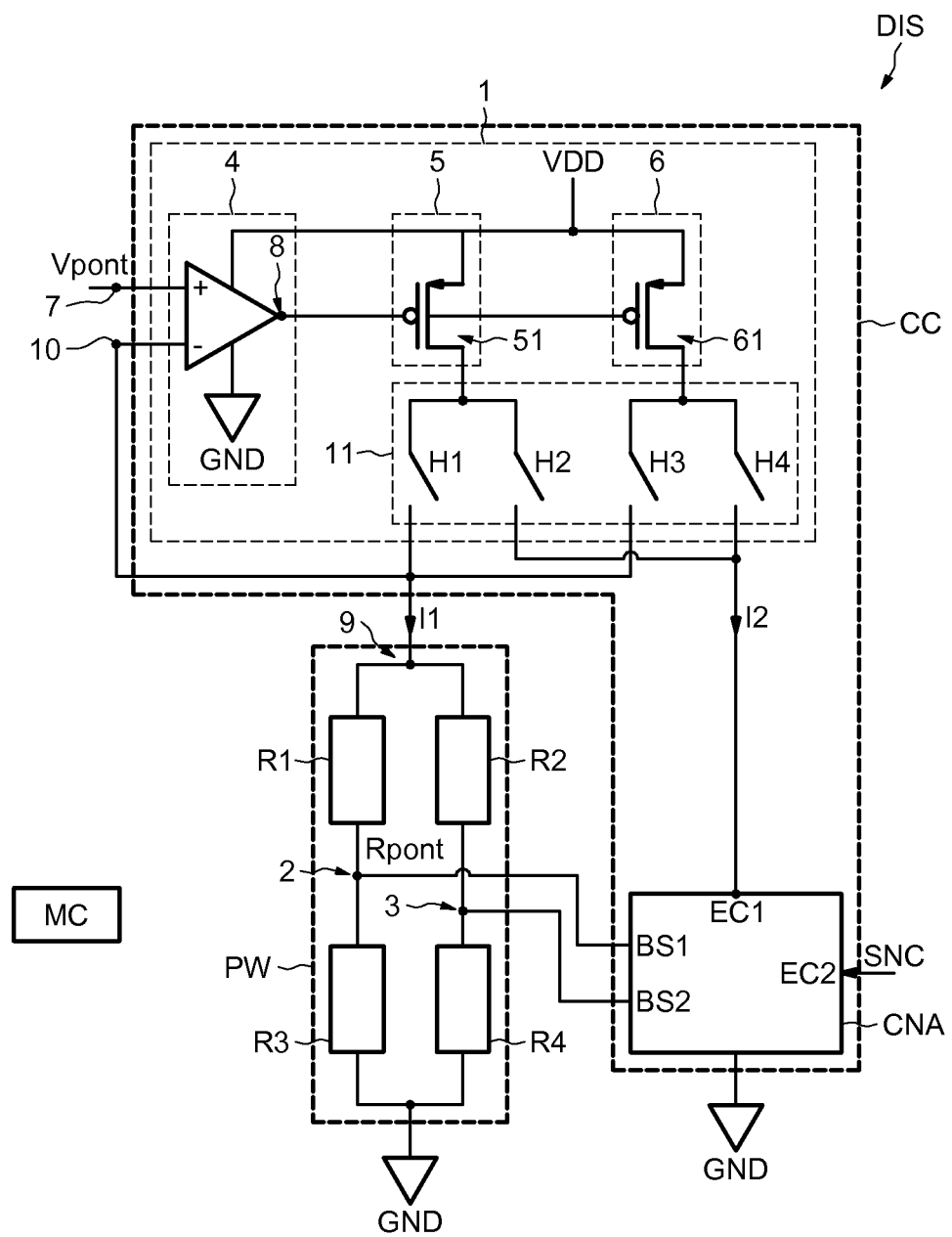

Reference is now made to FIG. 2 in order to illustrate another embodiment of the electronic device.

Only the differences between the two embodiments are described below.

First, the current sources 5 and 6 use PMOS transistors instead of bipolar transistors as in the previous embodiment.

Furthermore, a network of chopper circuits 11 are added in the supply module 1.

The current source 5 comprises a first PMOS transistor 51, of which the gate is coupled to the output 8 of the follower amplifier 4 and the drain is coupled to the supply terminal 9 of the circuit of the Wheatstone bridge PW through a first chopper circuit H1 and to the first converter input EC1 through a second chopper circuit H2.

In the same way, the current source 6 comprises a second PMOS transistor 61, of which the gate is coupled to the output 8 of the follower amplifier 4 and the drain is coupled to the supply terminal 9 of the circuit of the Wheatstone bridge PW through a third chopper circuit H3 and to the first converter input EC1 through a fourth chopper circuit H4.

The electronic device DIS furthermore comprises a control circuit MC, formed for example from logic circuits or as software in a microcontroller, which are configured in order to control the chopper circuits so that the chopper circuits H2 and H3 are open when the chopper circuits H1 and H4 are closed, and vice versa.

When the chopper circuits H1 and H4 are closed, the current source 5 delivers a first current I1 in order to supply the Wheatstone bridge, and the current source 6 delivers a second current I2 to the first converter input EC1 as a reference current.

The current source 5 then forms the first current source and the current source 6 forms the second current source.

When the chopper circuits H2 and H3 are closed, the first current I1 is then delivered by the current source 6 and the second current I2 is delivered by the current source 5.

The current source 6 then forms the first current source and the current source 5 forms the second current source.

The 1/f noise of the MOS transistor of the current source 5, which is fed back to the input 10 of the follower amplifier 4, may be attenuated by the presence of the loop. This is not the case for the MOS transistor which is not in the loop.

Thus, in order to limit the 1/f noise coming from the current sources 5 and 6, the control circuit MC controls the chopper circuits H1 to H4 in order to make them operate alternately as a network of switches in order to distribute over time that of the PMOS transistors which will be fed back to the follower amplifier 4 or connected to the first input of the converter EC1.

For this reason, the 1/f noise of the current sources can be reduced significantly with the aid of this network of chopper circuits 11.

The invention is not limited to the embodiments which have just been described, but encompasses all variants thereof.

Thus, the current sources may comprise a plurality of transistors in parallel.

When the transistors are MOS transistors, chopper circuits may then be added in order to distribute over time the number of MOS transistors forming the first current source which is fed back, and those forming the second current source.

Lastly, it is possible to provide for example a voltage divider or a gain between the inverting input of the amplifier and the supply terminal 9 so as to deliver a second voltage proportional to the voltage Vpont to the supply terminal 9.

The invention claimed is:

1. An electronic device, comprising:
   a Wheatstone bridge circuit including first and second output terminals; and
   a correction circuit coupled to the Wheatstone bridge circuit, said correction circuit configured to correct an offset of an output voltage at said first and second output terminals of the Wheatstone bridge circuit, said correction circuit comprising:
      an input interface configured to receive a first voltage,
      a supply module configured to supply the Wheatstone bridge circuit with a second voltage drawn from the first voltage and with a first current slaved to a resistance of the resistors of the Wheatstone bridge circuit and to generate a second current proportional to the first current, and
      a digital/analog converter configured to generate first and second correction currents in response to a digital correction signal and the second current and further directly apply said first and second correction currents to the first and second output terminals, respectively, of the Wheatstone bridge circuit.

2. The device according to claim 1, wherein the second voltage is equal or proportional to the first voltage.

3. The device according to claim 1, wherein the digital/analog converter comprises a first converter input configured to receive the second current, a second converter input configured to receive the digital correction signal and a differential current output formed by said first and second correction currents coupled to the first and second output terminals of the Wheatstone bridge circuit in order to deliver the correction current.

4. The device according to claim 1, wherein the supply module comprises a first current source configured to deliver the first current and driven by a follower amplifier,
   wherein one input of the follower amplifier is coupled to the input interface, the output of the first current source is coupled to a supply terminal of the Wheatstone bridge circuit, and the output of the first current source is further coupled to another input of the follower amplifier, and
   a second current source configured to deliver the second current and driven by the follower amplifier.

5. The device according to claim 4, wherein the first current source comprises at least one first bipolar transistor having a base coupled to the output of the follower amplifier and a collector coupled to the supply terminal of the Wheatstone bridge circuit, and wherein the second current source comprises at least one second bipolar transistor having a base coupled to the output of the follower amplifier and a collector coupled to the first converter input.

6. The device according to claim 4,
   wherein the digital/analog converter comprises a first converter input configured to receive the second current, a second converter input configured to receive the digital correction signal and a differential current output formed by said first and second correction currents coupled to said first and second output terminals of the Wheatstone bridge circuit in order to deliver the correction current; and wherein the supply module comprises:
at least one first PMOS transistor having a gate coupled to the output of the follower amplifier and a drain coupled to the supply terminal of the Wheatstone bridge circuit through a first chopper circuit and coupled to the first converter input through a second chopper circuit,
at least one second PMOS transistor having a gate coupled to the output of the follower amplifier and a drain coupled to the supply terminal of the Wheatstone bridge circuit and fed back onto the another input of the follower amplifier through a third chopper circuit and coupled to the first converter input through a fourth chopper circuit, and
a control circuit configured to control the first, second, third and fourth chopper circuits so that the first current source alternately comprises the at least one first PMOS transistor or the at least one second PMOS transistor, and the second current source alternately comprises the at least one second PMOS transistor or the at least one first PMOS transistor.

7. The device of claim 1, wherein said Wheatstone bridge circuit comprises:
a first supply terminal;
a second supply terminal;
a first resistor directly connected between the first supply terminal and the first output terminal;
a second resistor directly connected between the first supply terminal and the second output terminal;
a third resistor directly connected between the first output terminal the second supply terminal; and
a fourth resistor directly connected between the second output terminal the second supply terminal.

8. A circuit, comprising:
a Wheatstone bridge circuit having a first supply terminal, a first output terminal and a second output terminal;
a digital/analog converter circuit having a differential current output configured to generate first and second differential correction currents which are directly applied to the first and second output terminals of the Wheatstone bridge circuit, respectively, and having a digital input configured to receive a digital control signal and having an analog input; and
a supply circuit comprising a first current source generating a first supply current applied to the first supply terminal of the Wheatstone bridge circuit and a second current source generating a second supply current applied to the analog input of the digital/analog converter circuit, wherein the first and second current sources are coupled in a current mirror configuration.

9. The circuit of claim 8, wherein the supply circuit further comprises an amplifier having a first input coupled to receive a reference voltage, a second input coupled to receive a voltage at the first supply terminal of the Wheatstone bridge circuit and an output coupled to control terminals of the first and second current sources.

10. The circuit of claim 8, wherein the supply circuit further comprises a chopper circuit, comprising:
a first switch coupled between an output of the first current source and the first supply terminal of the Wheatstone bridge circuit;
a second switch coupled between the output of the first current source and the analog input of the digital/analog converter circuit.

11. The circuit of claim 10, further comprising a control circuit for alternately actuating the first and second switches.

12. The circuit of claim 8, wherein the supply circuit further comprises a chopper circuit, comprising:
a first switch coupled between an output of the second current source and the first supply terminal of the Wheatstone bridge circuit;
a second switch coupled between the output of the second current source and the analog input of the digital/analog converter circuit.

13. The circuit of claim 12, further comprising a control circuit for alternately actuating the first and second switches.

14. The circuit of claim 8, wherein the supply circuit further comprises a chopper circuit, comprising:
a first switch coupled between an output of the first current source and the first supply terminal of the Wheatstone bridge circuit;
a second switch coupled between the output of the first current source and the analog input of the digital/analog converter circuit;
a third switch coupled between an output of the second current source and the first supply terminal of the Wheatstone bridge circuit; and
a fourth switch coupled between the output of the second current source and the analog input of the digital/analog converter circuit.

15. The circuit of claim 14, further comprising a control circuit configured to:
simultaneously actuate the first and fourth switches; and
simultaneously actuate the second and third switches.

16. The circuit of claim 15, wherein simultaneous actuation of the first and fourth switches alternates with simultaneous actuation of the second and third switches.

17. The circuit of claim 8, wherein the first and second correction currents of the differential current output are generated in response to the digital control signal at the digital input and the second current at the analog input.

18. The circuit of claim 8, wherein said Wheatstone bridge circuit comprises:
a second supply terminal;
a first resistor directly connected between the first supply terminal and the first output terminal;
a second resistor directly connected between the first supply terminal and the second output terminal;
a third resistor directly connected between the first output terminal the second supply terminal; and
a fourth resistor directly connected between the second output terminal the second supply terminal.

19. An electronic device, comprising:
a Wheatstone bridge circuit including a first supply terminal and first and second output terminals;
a supply module configured to apply a supply voltage to the supply terminal of the Wheatstone bridge circuit;
a differential current generator circuit configured to generate first and second differential correction currents in response to a correction signal, said first and second differential correction currents directly applied to the first and second output terminals, respectively, of the Wheatstone bridge circuit to correct for an offset in an output voltage at said first and second output terminals; wherein
the differential current generator comprises a digital/analog converter have a digital input configured to receive correction signal and differential analog outputs configured to generate the first and second differential correction currents; and
wherein the supply module comprises:

a voltage follower circuit having an output;

a first current source having a control terminal coupled to the output of the voltage follower circuit and a conduction terminal generating the supply voltage applied to the supply terminal of the Wheatstone bridge circuit; and a second current source having a control terminal coupled to the output of the voltage follower circuit and a conduction terminal coupled to an analog input of the digital/analog converter.

20. The device of claim 19, wherein said Wheatstone bridge circuit comprises:

a second supply terminal;

a first resistor directly connected between the first supply terminal and the first output terminal;

a second resistor directly connected between the first supply terminal and the second output terminal;

a third resistor directly connected between the first output terminal the second supply terminal; and a fourth resistor directly connected between the second output terminal the second supply terminal.

\* \* \* \* \*